(12) United States Patent
Ho

(10) Patent No.: US 11,139,602 B2
(45) Date of Patent: Oct. 5, 2021

(54) ELECTRICAL CONNECTOR AND ASSEMBLY METHOD THEREOF

(71) Applicant: LOTES CO., LTD, Keelung (TW)

(72) Inventor: Chien Chih Ho, Keelung (TW)

(73) Assignee: LOTES CO., LTD, Keelung (TW)

( * ) Notice: Subject to any disclaimer, the term of this patent is extended or adjusted under 35 U.S.C. 154(b) by 0 days.

(21) Appl. No.: 16/797,087

(22) Filed: Feb. 21, 2020

(65) Prior Publication Data

US 2020/0313333 A1    Oct. 1, 2020

(30) Foreign Application Priority Data

Mar. 29, 2019    (CN) .......................... 201910249139.2

(51) Int. Cl.
| | |
|---|---|
| H01R 13/24 | (2006.01) |
| H01R 12/58 | (2011.01) |
| H01R 12/70 | (2011.01) |
| H01R 12/71 | (2011.01) |
| H01R 43/02 | (2006.01) |
| H01R 43/20 | (2006.01) |

(52) U.S. Cl.
CPC ......... *H01R 13/2407* (2013.01); *H01R 12/58* (2013.01); *H01R 12/7082* (2013.01); *H01R 12/714* (2013.01); *H01R 43/0256* (2013.01); *H01R 43/205* (2013.01); *H01R 12/707* (2013.01)

(58) Field of Classification Search
CPC .. H01R 12/58; H01R 12/7082; H01R 12/714; H01R 12/707; H01R 13/2407; H01R 43/205; H01R 43/0246
See application file for complete search history.

(56) References Cited

U.S. PATENT DOCUMENTS

| | | | |
|---|---|---|---|
| 8,118,602 B2* | 2/2012 | Beaman ............. | H01R 13/2407 439/66 |
| 10,483,666 B2* | 11/2019 | Taguchi ............... | H05K 7/1038 |

FOREIGN PATENT DOCUMENTS

| | | |
|---|---|---|
| CN | 201311971 Y | 9/2009 |
| CN | 201332147 Y | 10/2009 |
| CN | 101997190 B | 5/2014 |
| CN | 102117986 B | 12/2014 |
| CN | 103208707 B | 4/2015 |
| CN | 108695612 A | 10/2018 |

* cited by examiner

*Primary Examiner* — Briggitte R. Hammond
(74) *Attorney, Agent, or Firm* — Locke Lord LLP; Tim Tingkang Xia, Esq.

(57) ABSTRACT

An electrical connector and an assembly method thereof are disclosed. The electrical connector includes a substrate provided with multiple accommodating holes, and multiple terminals. Each of the first terminals has a first insertion portion inserted downward into a corresponding accommodating hole, a first strip connecting portion to be connected to a first strip, and a first soldering portion located outside the corresponding accommodating hole and soldered on an upper surface of the substrate. A bottom portion of the first insertion portion, the first strip connecting portion and the first soldering portion are located on a same first plane, such that the first terminals are not easy to twist when the strip is bent and when being inserted into the substrate, thereby allowing the first terminals to be assembled stably.

17 Claims, 10 Drawing Sheets

ELECTRICAL CONNECTOR AND ASSEMBLY METHOD THEREOF

CROSS-REFERENCE TO RELATED PATENT APPLICATION

This non-provisional application claims priority to and the benefit of, pursuant to 35 U.S.C. § 119(a), patent application Serial No. CN201910249139.2 filed in China on Mar. 29, 2019. The disclosure of the above application is incorporated herein in its entirety by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present invention relates to an electrical connector and an assembly method thereof, and particularly to an electrical connector for electrically connecting a chip module and a circuit board and an assembly method thereof.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

The Chinese Patent No. CN20181027361.6 discloses an electrical connector, which is used to electrically connect a chip module. The electrical connector includes a shell provided with a first surface and a second surface opposite to each other. The shell includes a through hole vertically running through the first surface and the second surface, and an inner wall surface of the through hole is plated with a conductive material. A conductive pad is provided on the first surface of the shell and electrically connected with the conductive material of the through hole. A contact member is accommodated in the through hole and provided on the first surface of the shell. The contact member includes a first connecting portion provided horizontally and soldered to the conductive pad. A first insertion portion bends and extends downward from one side of the first connecting portion to be inserted into the through hole. The first insertion portion is pressed against the inner wall surface of the through hole and elastically deform, and is in contact with the conductive material of the inner wall surface of the through hole. A first strip connecting portion extends upward from the other opposite side of the first connecting portion to be connected to a strip. A first contact point portion extends upward and side-by-side with the first insertion portion from the first connecting portion to be electrically connected to a first contact pad. The lower end of the through hole is electrically connected to a second contact pad.

However, since the first insertion portion, the strip connecting portion and the first connecting portion are not located on a same plane, the contact member is easy to twist when the strip is bent and when being inserted into the shell, thus affecting the assembly of the contact member.

Therefore, a heretofore unaddressed need to design a novel electrical connector and an assembly method thereof exists in the art to address the aforementioned deficiencies and inadequacies.

SUMMARY

The present invention is directed to an electrical connector with terminals being assembled stably, and an assembly method thereof.

To achieve the foregoing objective, the present invention adopts the following technical solutions.

An electrical connector includes: a substrate, provided with a plurality of accommodating holes; and a plurality of first terminals, wherein each of the first terminals has a first insertion portion inserted downward into a corresponding accommodating hole of the accommodating holes, a first strip connecting portion configured to be connected to a first strip, and a first soldering portion located outside the corresponding accommodating hole and soldered on an upper surface of the substrate, and a bottom portion of the first insertion portion, the first strip connecting portion and the first soldering portion are located on a same first plane.

In certain embodiments, each of the first terminals has two first soldering portions, and the first insertion portion is located between the two first soldering portions.

In certain embodiments, the first strip connecting portion is located right above the first soldering portion.

In certain embodiments, each of the first terminals is provided with a first elastic arm upward abutting a first mating component, the first insertion portion comprises a first portion and a second portion formed by bending upward and extending from a bottom portion of the first portion, the first portion and the second portion respectively abut the corresponding accommodating hole, the bottom portion of the first insertion portion is the bottom portion of the first portion, the first portion, the first strip connecting portion and the first soldering portion are located on the same first plane, and the second portion is located right below the first elastic arm.

In certain embodiments, the first terminals comprise a plurality of ground terminals and a plurality of signal terminals, the substrate is a circuit board, the upper surface of the substrate is provided with a metal layer being grounded, the first soldering portion is soldered to the metal layer, the metal layer is electrically connected with the first soldering portions of the ground terminals, the upper surface of the substrate has an isolation slot surrounding the first soldering portions of the signal terminals to electrically isolate the signal terminals from one another.

In certain embodiments, the first insertion portion is flat plate shaped, and the first insertion portion, the first strip connecting portion and the first soldering portion are located on the same first plane.

In certain embodiments, the electrical connector further includes a plurality of second terminals, wherein each of the first terminals is provided with a first elastic arm configured to upward abut a first mating component, each of the accommodating holes further accommodates one of the second terminals electrically connected with a corresponding one of the first terminals, each of the second terminals has a second elastic arm downward abutting a second mating component, a second insertion portion inserted in the corresponding accommodating hole, a second soldering portion located outside the corresponding accommodating hole and soldered on a lower surface of the substrate, and a second strip connecting portion configured to be connected to a second strip, and the second strip connecting portion and the second soldering portion are located on a same second plane.

In certain embodiments, the first terminals and the second terminals have identical structures.

In certain embodiments, the second insertion portion is flat plate shaped, and the second insertion portion, the second strip connecting portion and the second soldering portion are disposed on the same second plane.

In certain embodiments, the first insertion portion and the second insertion portion are parallel to each other and in contact with each other in a horizontal direction.

An assembly method of an electrical connector includes: S1: providing a strip being connected to a plurality of terminals to be inserted in a substrate, wherein the substrate is provided with a plurality of accommodating holes, each of the terminals has a strip connecting portion connected to the strip, an insertion portion downward inserted in a corresponding accommodating hole of the accommodating holes and a soldering portion, and the insertion portion, the strip connecting portion and the soldering portion are located on a same plane; S2: soldering the soldering portion to an upper surface of the substrate; and S3: cutting the strip, such that the terminals are separated from the strip.

Compared with the related art, the electrical connector and the assembly method thereof according to certain embodiments of the present invention has the following beneficial effects.

Since the first portion, the first strip connecting portion and the first soldering portion are located on the same first plane, the first terminals are not easy to twist when the strip is bent and when being inserted into the substrate, thereby allowing the first terminals to be assembled stably.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

Figure 1:
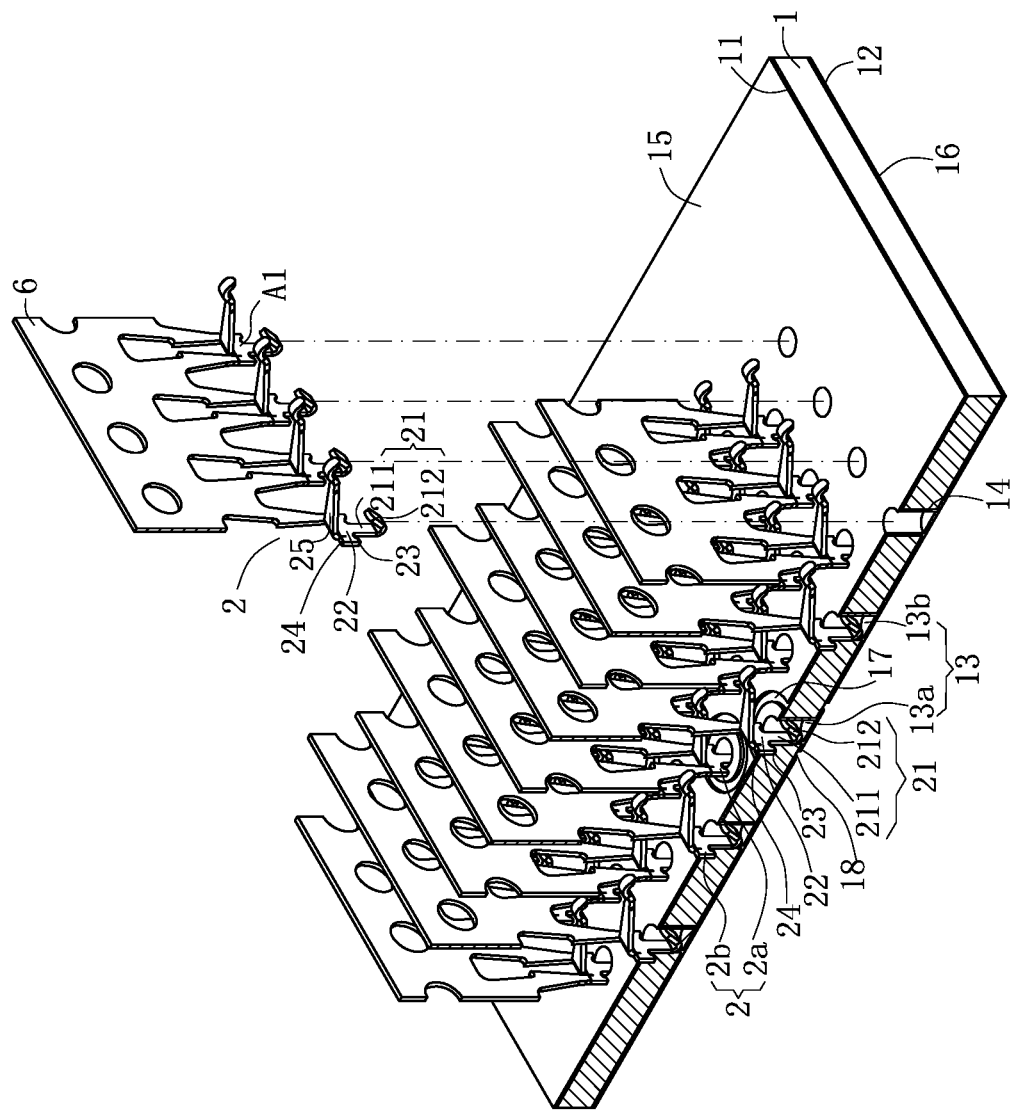
FIG. 1 is a perspective section view of an electrical connector according to a first embodiment of the present invention, in which a first strip is connected to first terminals to be inserted in a substrate.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1-10. In accordance with the purposes of this invention, as embodied and broadly described herein, this invention, in one aspect, relates to an electrical connector and an assembly method thereof.

FIG. 1 to FIG. 5 show an electrical connector 100 according to a first embodiment of the present invention. The electrical connector 100 is used for electrically connecting a first mating component 8 to a second mating component 4, and includes a substrate 1 and multiple first terminals 2 accommodated in the substrate 1. In the present embodiment, the first mating component 8 is a chip module, and the second mating component 4 is a main circuit board.

Figure 2:
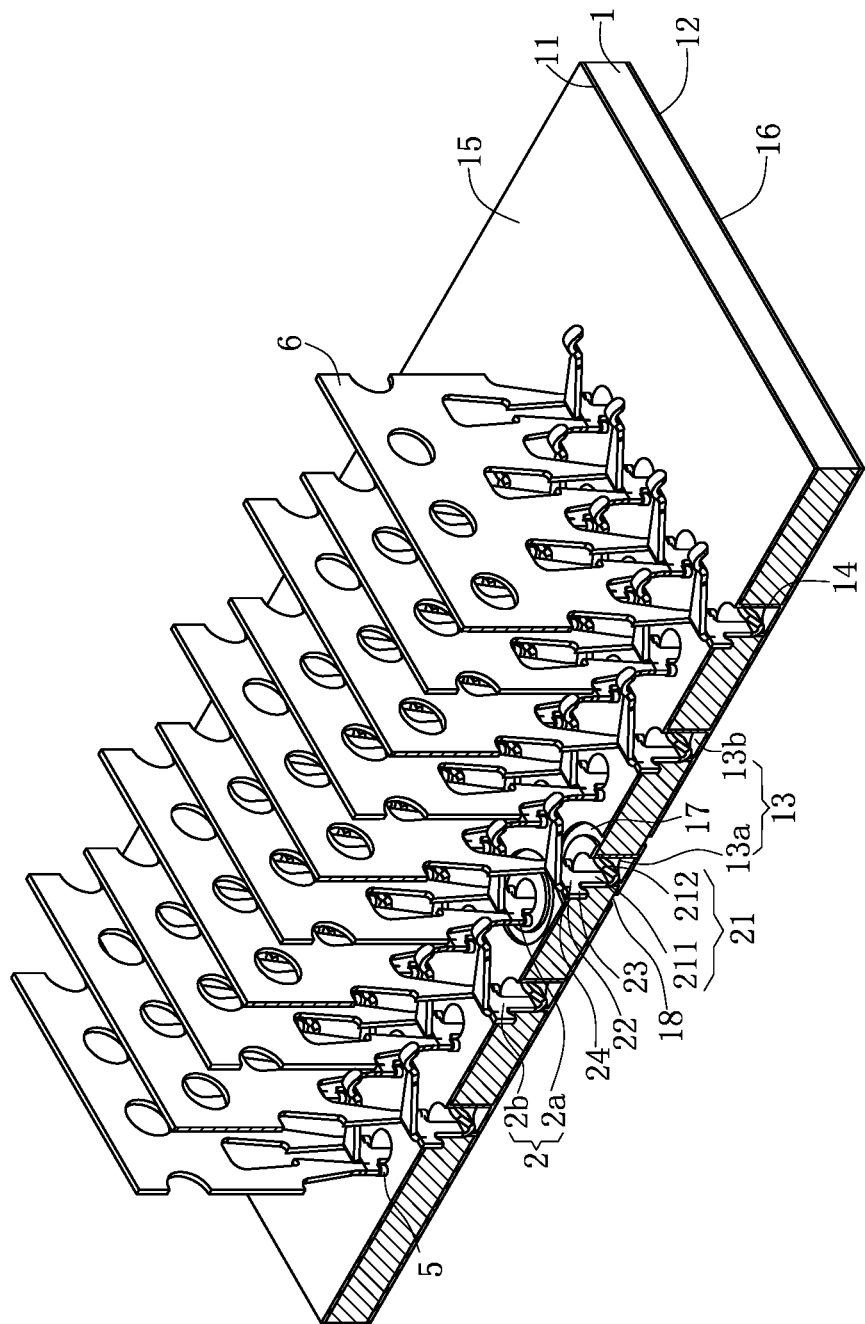
FIG. 2 is a perspective section view of the electrical connector according to the first embodiment of the present invention, in which the first strip is connected to the first terminals to be soldered onto the upper surface of the substrate.
Figure 3:
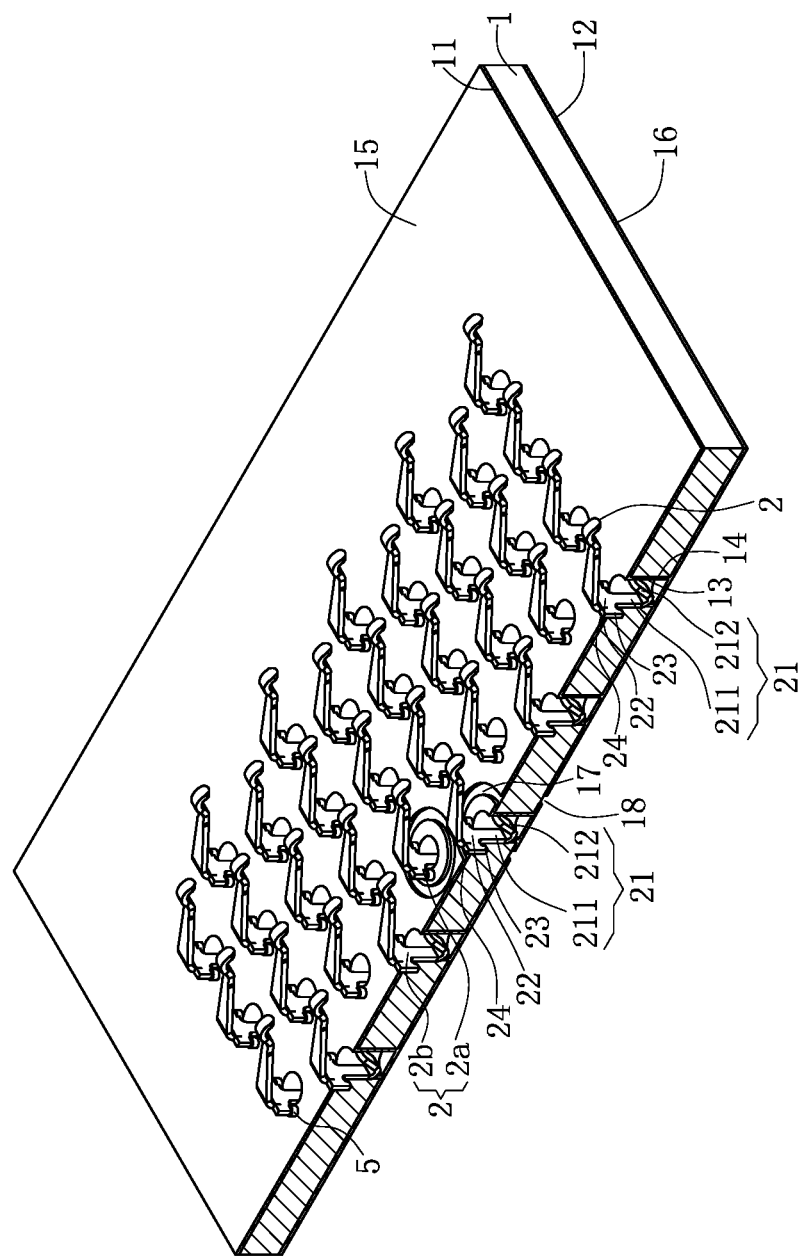
FIG. 3 is a perspective section view of FIG. 2 with the first strip being removed.

As shown in FIG. 1 to FIG. 3, in the present embodiment, the substrate 1 is a circuit board. The substrate 1 has an upper surface 11 and a lower surface 12 provided opposite to each other. The substrate 1 is provided with multiple accommodating holes 13 running through the upper surface 11 and the lower surface 12 vertically. An inner wall of each accommodating hole 13 is provided with a conductive layer 14. The upper surface 11 is provided with a first metal layer 15, and the lower surface 12 is provided with a second metal layer 16. The conductive layer 14 (the conductive layer 14 can be a metal material) can be formed on the inner wall of each accommodating hole 13 by coating, adhering or injection molding. The first metal layer 15 and the second metal layer 16 can also be formed on the upper surface 11 and the lower surface 12 of the substrate 1 by coating, adhering or injection molding.

As shown in FIG. 1, FIG. 4, FIG. 5 and FIG. 9, each of the first terminals 2 has a first insertion portion 21 inserted downward into the corresponding accommodating hole 13. The first insertion portion 21 includes a first portion 211 and a second portion 212 formed by bending upward and extending from a bottom portion of the first portion 211. That is, the bottom portion P of the first insertion portion 21 is the bottom portion of the first portion 211. The first portion 211 and the second portion 212 both abut the corresponding accommodating hole 13 and in contact with the conductive layer 14. A first flat portion 22 vertically extends upward from the first portion 211 and is located outside the corresponding accommodating hole 13. Two first soldering portions 23 vertically extend downward from two opposite sides of the first flat portion 22, and the two first soldering portions 23 are located outside the corresponding accommodating hole 13 and soldered to the first metal layer 15. In other embodiments, each of the first terminals 2 may include only one first soldering portion 23. The first insertion portion 21 is located between the two first soldering portions 23. The bottom portion P of the first insertion portion 21, the two first soldering portions 23 and the first flat portion 22 are located on a same first plane A1. Two first strip connecting portions 24 vertically extend upward from two opposite sides of the first flat portion 22 to be connected to a first strip 6. In other embodiments, each of the first terminals 2 may include only one first strip connecting portion 24. The two first strip connecting portions 24 are correspondingly located right above the first soldering portions 23, and the first strip connecting portions 24, the first soldering portions 23 and the first portion 211 are located on the same first plane A1. A first elastic arm 25 is formed by bending upward and extending from the first flat portion 22 to upward abut the first mating component 8. The first elastic arm 25 is located between the two first strip connecting portions 24, and the second portion 212 is located right below the first elastic arm 25.

Figure 4:
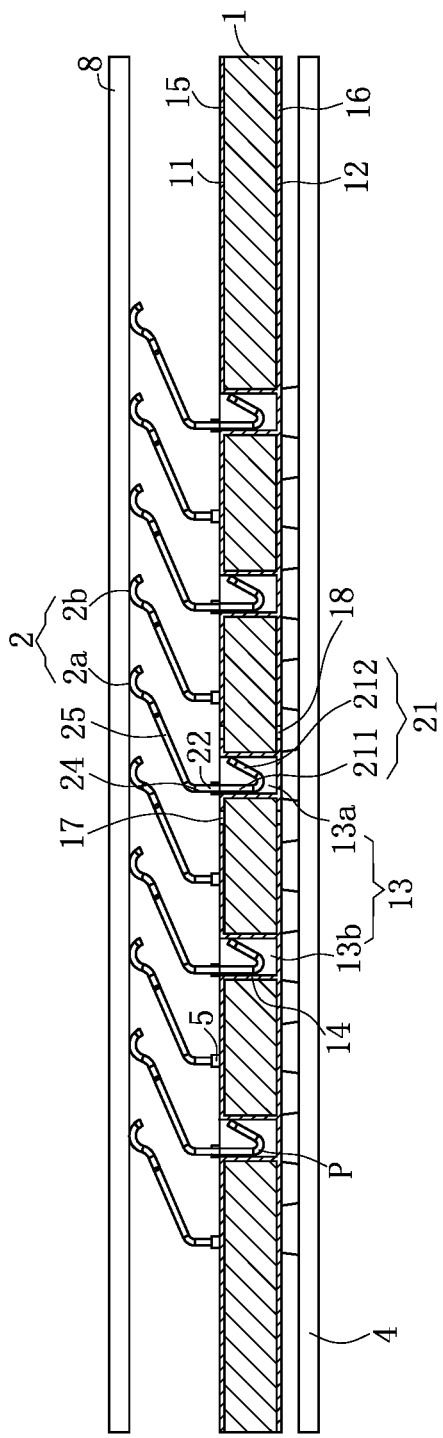
FIG. 4 is a sectional view of the electrical connector being soldered to a main circuit board according to the first embodiment of the present invention.
Figure 5:
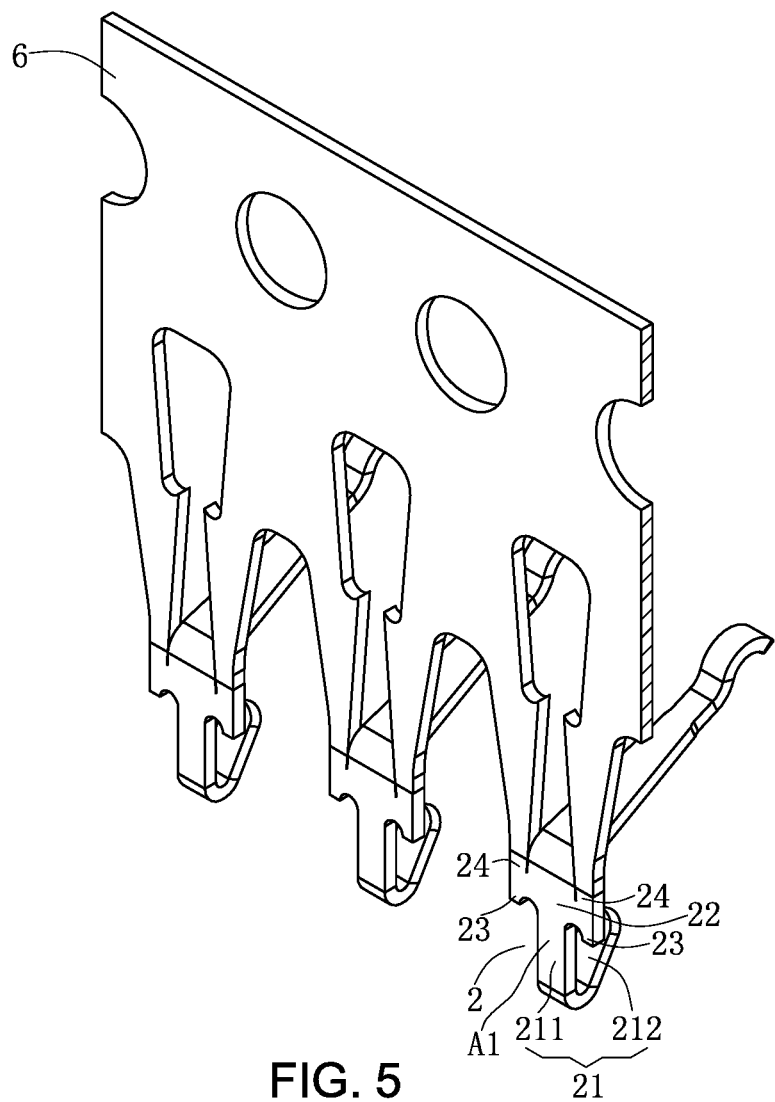
FIG. 5 is a perspective schematic view of the first terminals being connected to the first strip according to the first embodiment of the present invention.
Figure 6:
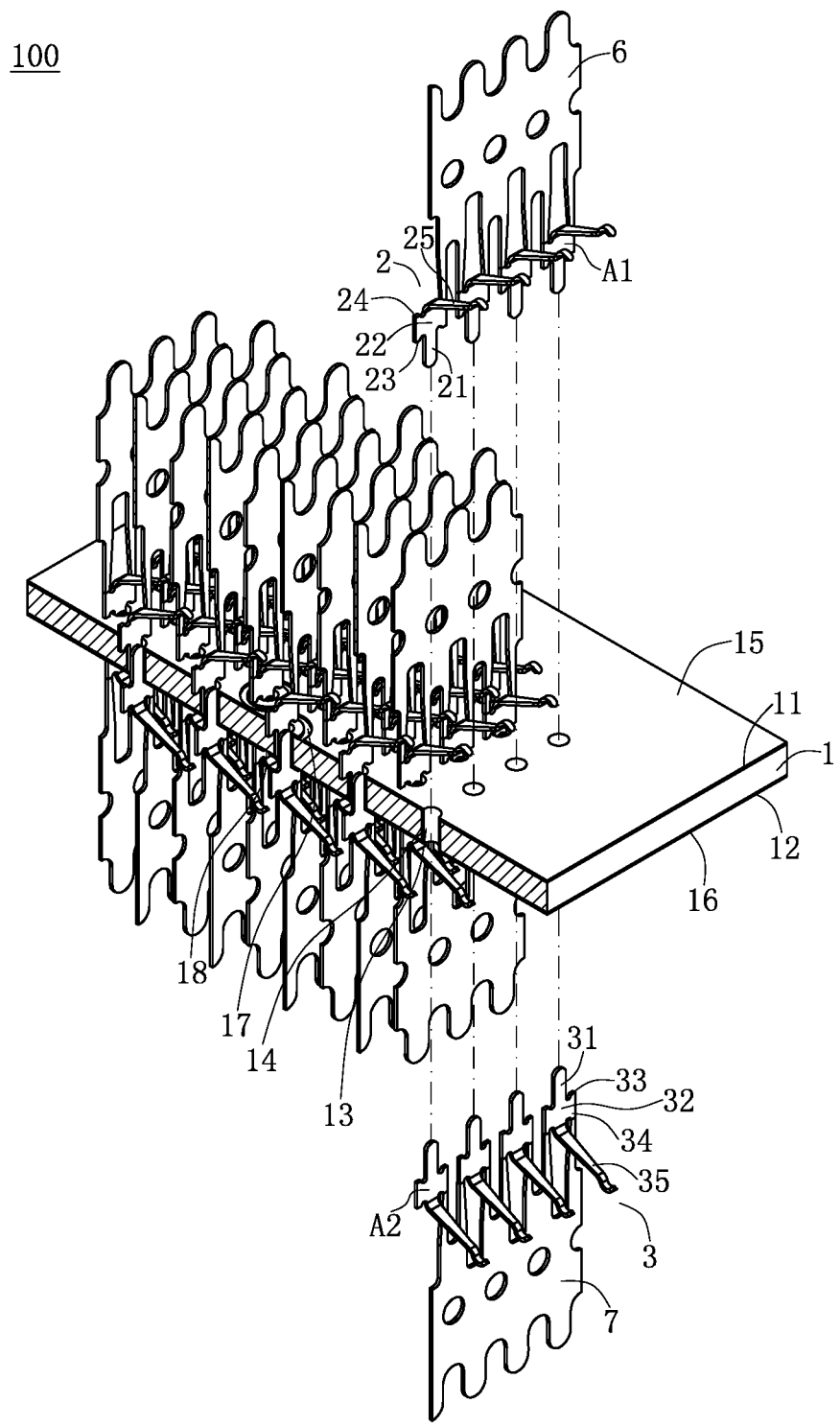
FIG. 6 is a perspective section view of an electrical connector according to a second embodiment of the present invention, in which the first strip is connected to first terminals and a second strip is connected to second terminals to be inserted in a substrate.

As shown in FIG. 2 to FIG. 4, the first terminals 2 include multiple first signal terminals 2a and multiple first ground terminals 2b. The first signal terminals 2a and the first ground terminals 2b have identical structures, and are all in contact with the conductive layers 14 of the inner walls of the accommodating holes 13. The accommodating holes 13 include multiple signal accommodating holes 13a accommodating the first signal terminals 2a and multiple ground accommodating holes 13b accommodating the first ground terminals 2b. Since the first soldering portions 23 of the first ground terminals 2b are respectively soldered to the first metal layer 15, the first soldering portions 23 of the first ground terminals 2b can be electrically connected together, thereby improving the high frequency performance. The upper surface 11 is provided with a first isolation slot 17 surrounding the first soldering portions 23 of the first signal terminals 2a to electrically isolate the first signal terminals 2a from one another.

FIG. 1 to FIG. 4 also show an assembly method of the electrical connector 100 according to the first embodiment of the present invention, which includes the following steps:

S1: A first strip 6 is provided to be connected to multiple first terminals 2 to be inserted in a substrate 1.

S2: A solder material 5 is coated on a first metal layer 15 at positions corresponding to first soldering portions 23. Alternatively, the first soldering portions 23 are coated with the solder material 5. Then, the first soldering portions 23 are soldered on the upper surface 11 of the substrate 1.

S3: The first strip 6 is cut, such that the first terminals 2 are separated from the first strip 6.

After the step S3, the substrate 1 is soldered to the main circuit board 4, and the soldering temperature at this time is lower than the soldering temperature in step S2.

FIG. 6 to FIG. 10 show an electrical connector 100 according to a second embodiment of the present invention, which is different from the first embodiment in that the first insertion portion 21 does not have the second portion 212 bending upward and extending from the bottom portion P of the first portion 211. That is, the first insertion portion 21 is flat plate shaped. Further, the first insertion portion 21, the first strip connecting portions 24 and the first soldering portions 23 are located on the same first plane A1. Moreover, each of the accommodating holes 13 also accommodate a second terminal 3 electrically connected with the first terminal 2. Each second terminal 3 includes a second insertion portion 31 inserted in the corresponding accommodating hole 13, and the second insertion portion 31 is flat plate shaped. A second flat portion 32 vertically extend downward from the second insertion portion 31 and is located outside the corresponding accommodating hole 13. Two second soldering portions 33 vertically extend upward from two opposite sides of the second flat portion 32. The two second soldering portions 33 are located outside the corresponding accommodating hole 13 and soldered to a second metal layer 16. In other embodiments, each of the second terminals 3 may include only one second soldering portion 33. The second insertion portion 31 is located between the two second soldering portions 33. The second insertion portion 31, the two second soldering portions 33 and the second flat portion 32 are located on a same second plane A2. Two second strip connecting portions 34 vertically extend downward from two opposite sides of the second flat portion 32 to be connected to a second strip 7. In other embodiments, each of the second terminals 3 may include only one second strip connecting portion 34. The two second strip connecting portions 34 are correspondingly located right below the two second soldering portions 33, and the second strip connecting portions 34, the second soldering portions 33 and a bottom portion Q of the second insertion portion 31 are located on the same second planeA2. A second elastic arm 35 is formed by bending downward and extending from the second flat portion 32 to downward abut a second mating component 4. The second elastic arm 35 is located between the two second strip connecting portions 34. In the present embodiment, the first terminals 2 and the second terminals 3 have identical structures. The first insertion portion 21 and the second insertion portion 31 are parallel to each other and attach to each other in a front-rear direction. The first insertion portion 21 and the second insertion portion 31 are both in contact with the conductive layer 14 on the inner wall of the corresponding accommodating hole 13. In other embodiments, the first insertion portion 21 and the second insertion portion 31 may not be conductively connected with the conductive layer 14.

Figure 7:
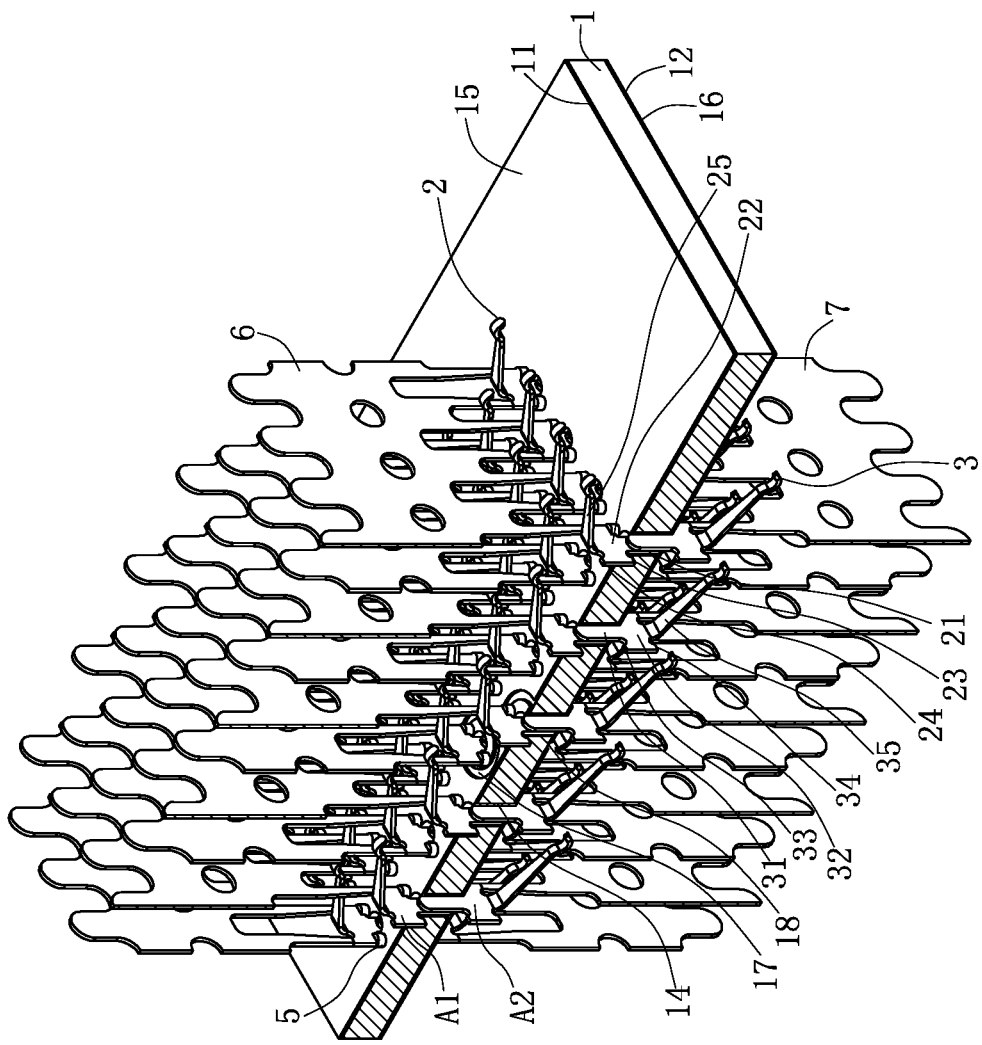
FIG. 7 is a perspective section view of the electrical connector according to the second embodiment of the present invention, in which the first strip is connected to the first terminals to be soldered on the upper surface of the substrate, and the second strip is connected to the second terminals to be soldered on the lower surface of the substrate.
Figure 8:
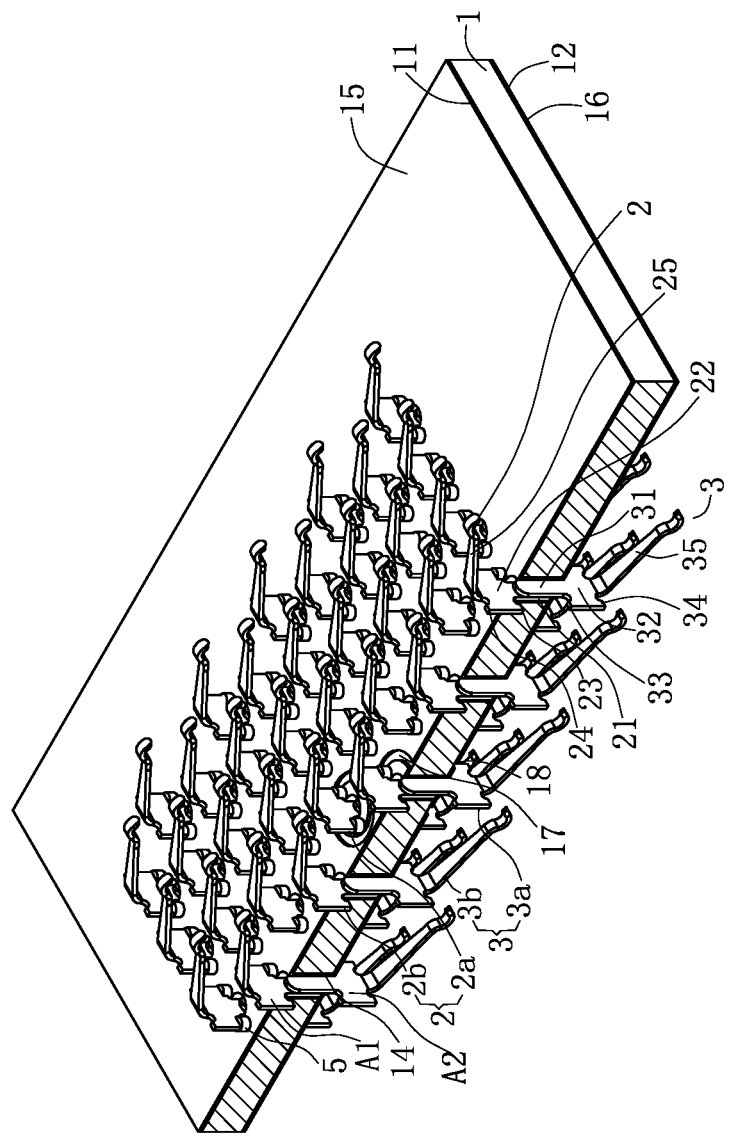
FIG. 8 is a perspective schematic view of FIG. 7 with the first strip and second strip being removed.
Figure 9:
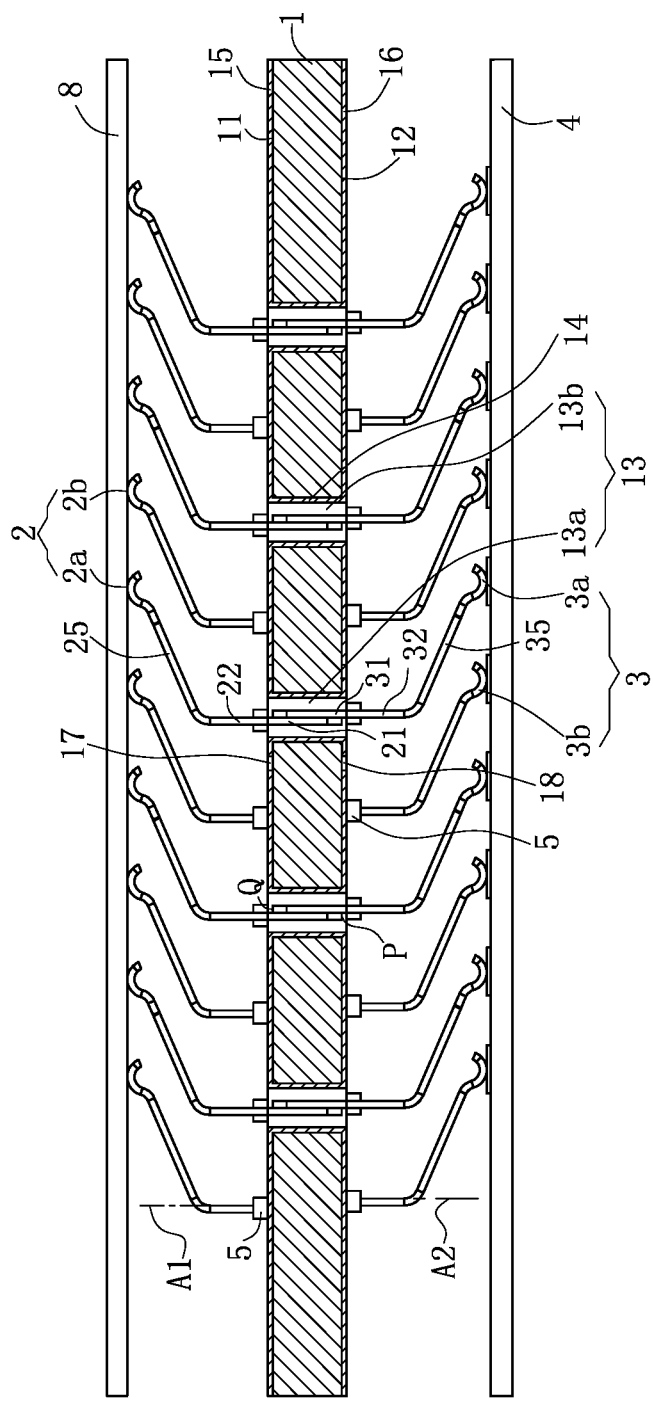
FIG. 9 is a sectional view of the second terminals of the electrical connector abutting a main circuit board according to the second embodiment of the present invention.
Figure 10:
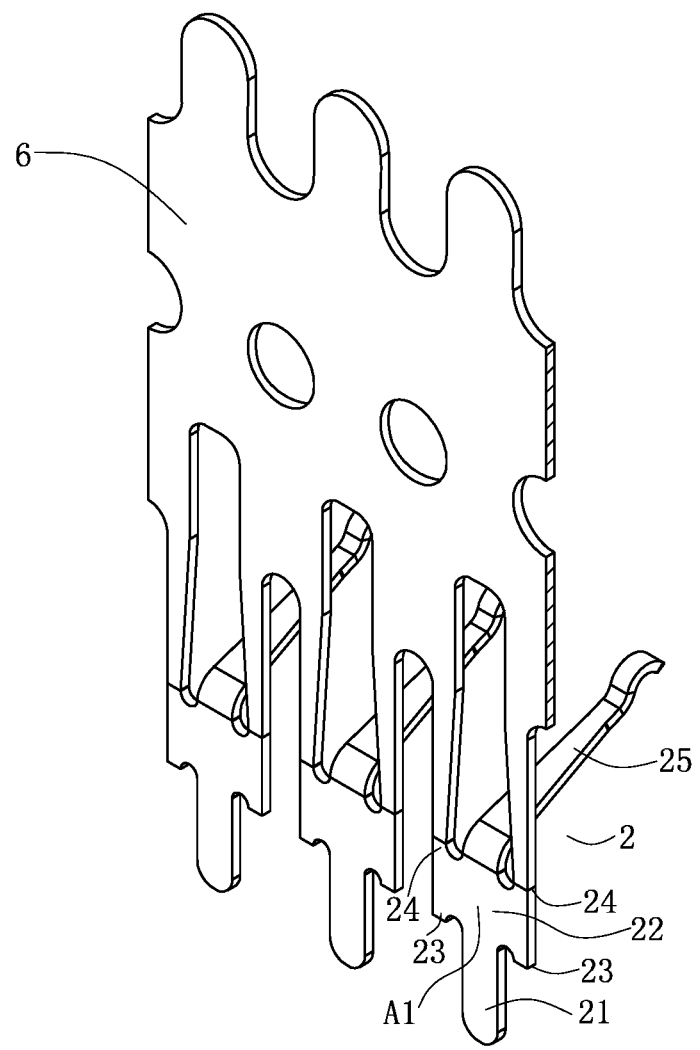
FIG. 10 is a perspective schematic view of the first terminals of the electrical connector being connected to the first strip according to the second embodiment of the present invention.

As shown in FIG. 7 to FIG. 9, the second terminals 3 include multiple second signal terminals 3a and multiple second ground terminals 3b. The second signal terminals 3a and the second ground terminals 3b have identical structures, and are all in contact with the conductive layers 14 of the inner walls of the accommodating holes 13. The second signal terminals 3a are accommodated in the signal accommodating holes 13a, and the second ground terminals 3b are accommodated in the ground accommodating holes 13b. Since the second soldering portions 33 of the second ground terminals 3b are respectively soldered on the second metal layer 16, the second soldering portions 33 of the second ground terminals 3b can be electrically connected together, thereby improving the high frequency performance. The lower surface 12 is provided with a second isolation slot 18 surrounding the second soldering portions 33 of the second signal terminals 3a to electrically isolate the second signal terminals 3a from one another. Other structures and functions are completely identical to those in the first embodiment, and are thus not elaborated herein.

FIG. 6 to FIG. 9 also show an assembly method of the electrical connector 100 according to the second embodiment of the present invention, which includes the following steps:

S1: The first strip 6 is provided to be connected to the first terminals 2, and the second strip 7 is provided to be connected to the second terminals 3, which are respectively inserted in the corresponding accommodating holes 13 of a substrate 1.

S2: The solder material 5 is coated on the first metal layer 15 at positions corresponding to the first soldering portions 23. Alternatively, the first soldering portions 23 are coated with the solder material 5. The solder material 5 is also coated on the second metal layer 16 at positions corresponding to the second soldering portions 33. Alternatively, the second soldering portions 33 are coated with the solder material 5. Then, the first soldering portions 23 are soldered on the upper surface 11 of the substrate 1, and the second soldering portions 33 are soldered on the lower surface 12 of the substrate 1.

S3: The first strip 6 and the second strip 7 are cut, such that the first terminals 2 are separated from the first strip 6, and the second terminals 3 are separated from the second strip 7.

After step S3, the second terminals 3 are conductively connected with a main circuit board 4.

Other assembly methods are completely identical to those in the first embodiment, and thus are not elaborated herein.

To sum up, the electrical connector 100 and the assembly method thereof according to certain embodiments of the present invention has the following beneficial effects:

(1) Since the first portion 211, the first strip connecting portions 24 and the first soldering portions 23 are located on the same first plane A1, the first terminals 2 are not easy to twist when the strip is bent and when being inserted into the substrate 1, thereby allowing the first terminals 2 to be assembled stably.

(2) Since the first ground terminals 2b are respectively soldered to the first metal layer 15, and the second ground terminals 3b are respectively soldered to the second metal layer 16, the first ground terminals 2b can be electrically connected together, and the second ground terminals 3b can be electrically connected together, thereby improving the high frequency performance.

(3) The two first soldering portions 23 are soldered to the first metal layer 15, such that the strength of the first insertion portion 21 can be improved, and the first insertion portion 21 can be prevented from bending and breaking from the junction with the first flat portion 22. The two second soldering portions 33 are soldered to the second metal layer 16, such that the strength of the second insertion portion 31 can be improved, and the second insertion portion 31 can be prevented from bending and breaking from the junction with the second flat portion 32.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connector, comprising:
a substrate, provided with a plurality of accommodating holes; and
a plurality of first terminals, wherein each of the first terminals has a first insertion portion inserted downward into a corresponding accommodating hole of the accommodating holes, a first strip connecting portion configured to be connected to a first strip, and a first soldering portion located outside the corresponding accommodating hole and soldered on an upper surface of the substrate, and a bottom portion of the first insertion portion, the first strip connecting portion and the first soldering portion are located on a same first plane;

wherein the first terminals comprise a plurality of ground terminals and a plurality of signal terminals, the substrate is a circuit board, the upper surface of the substrate is provided with a metal layer being grounded, the first soldering portion is soldered to the metal layer, the metal layer is electrically connected with the first soldering portions of the ground terminals, the upper surface of the substrate has an isolation slot surrounding the first soldering portions of the signal terminals to electrically isolate the signal terminals from one another.

2. The electrical connector according to claim 1, wherein each of the first terminals has two first soldering portions, and the first insertion portion is located between the two first soldering portions.

3. The electrical connector according to claim 1, wherein the first strip connecting portion is located right above the first soldering portion.

4. The electrical connector according to claim 1, wherein each of the first terminals is provided with a first elastic arm upward abutting a first mating component, the first insertion portion comprises a first portion and a second portion, the second portion is formed by bending upward and extending from a bottom portion of the first portion, the first portion and the second portion respectively abut the corresponding accommodating hole, the bottom portion of the first insertion portion is the bottom portion of the first portion, the first portion, the first strip connecting portion and the first soldering portion are located on the same first plane, and the second portion is located right below the first elastic arm.

5. The electrical connector according to claim 1, wherein the first insertion portion is flat plate shaped, and the first insertion portion, the first strip connecting portion and the first soldering portion are located on the same first plane.

6. The electrical connector according to claim 1, further comprising a plurality of second terminals, wherein each of the first terminals is provided with a first elastic arm configured to upward abut a first mating component, each of the accommodating holes further accommodates one of the second terminals electrically connected with a corresponding one of the first terminals, each of the second terminals has a second elastic arm downward abutting a second mating component, a second insertion portion inserted in the corresponding accommodating hole, a second soldering portion located outside the corresponding accommodating hole and soldered on a lower surface of the substrate, and a second strip connecting portion configured to be connected to a second strip, and the second strip connecting portion and the second soldering portion are located on a same second plane.

7. The electrical connector according to claim 6, wherein the first terminals and the second terminals have identical structures.

8. The electrical connector according to claim 6, wherein the second insertion portion is flat plate shaped, and the second insertion portion, the second strip connecting portion and the second soldering portion are disposed on the same second plane.

9. The electrical connector according to claim 6, wherein the first insertion portion and the second insertion portion are parallel to each other and in contact with each other in a horizontal direction.

10. An electrical connector, comprising:
a substrate, provided with a plurality of accommodating holes; and
a plurality of first terminals, wherein each of the first terminals has a first insertion portion inserted downward into a corresponding accommodating hole of the accommodating holes, a first strip connecting portion configured to be connected to a first strip, and a first soldering portion located outside the corresponding accommodating hole and soldered on an upper surface of the substrate, and a bottom portion of the first insertion portion, the first strip connecting portion and the first soldering portion are located on a same first plane; and
a plurality of second terminals, wherein each of the first terminals is provided with a first elastic arm configured to upward abut a first mating component, each of the accommodating holes further accommodates one of the second terminals electrically connected with a corresponding one of the first terminals, each of the second terminals has a second elastic arm downward abutting a second mating component, a second insertion portion inserted in the corresponding accommodating hole, a second soldering portion located outside the corresponding accommodating hole and soldered on a lower surface of the substrate, and a second strip connecting portion configured to be connected to a second strip, and the second strip connecting portion and the second soldering portion are located on a same second plane.

11. The electrical connector according to claim 10, wherein each of the first terminals has two first soldering portions, and the first insertion portion is located between the two first soldering portions.

12. The electrical connector according to claim 10, wherein the first strip connecting portion is located right above the first soldering portion.

13. The electrical connector according to claim 10, wherein each of the first terminals is provided with a first elastic arm upward abutting a first mating component, the first insertion portion comprises a first portion and a second portion, the second portion is formed by bending upward and extending from a bottom portion of the first portion, the first portion and the second portion respectively abut the corresponding accommodating hole, the bottom portion of the first insertion portion is the bottom portion of the first portion, the first portion, the first strip connecting portion and the first soldering portion are located on the same first plane, and the second portion is located right below the first elastic arm.

14. The electrical connector according to claim 10, wherein the first insertion portion is flat plate shaped, and the first insertion portion, the first strip connecting portion and the first soldering portion are located on the same first plane.

15. The electrical connector according to claim 10, wherein the first terminals and the second terminals have identical structures.

16. The electrical connector according to claim 10, wherein the second insertion portion is flat plate shaped, and the second insertion portion, the second strip connecting portion and the second soldering portion are disposed on the same second plane.

17. The electrical connector according to claim 10, wherein the first insertion portion and the second insertion portion are parallel to each other and in contact with each other in a horizontal direction.

* * * * *